(12) United States Patent
Gund et al.

(10) Patent No.: US 12,375,060 B2
(45) Date of Patent: Jul. 29, 2025

(54) DIGITALLY CONTROLLED LITHOGRAPHICALLY-DEFINED MULTI-FREQUENCY ACOUSTIC RESONATORS

(71) Applicant: Intel Corporation, Santa Clara, CA (US)

(72) Inventors: Ved V. Gund, Ithaca, NY (US); Kevin P. O'Brien, Portland, OR (US); Kimin Jun, Portland, OR (US); Edris Mohammed, Beaverton, OR (US); Arnab Sen Gupta, Aloha, OR (US); Matthew V. Metz, Portland, OR (US); Ibrahim L. Ban, Beaverton, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 17/483,651

(22) Filed: Sep. 23, 2021

(65) Prior Publication Data

US 2023/0091766 A1    Mar. 23, 2023

(51) Int. Cl.
*H03H 9/54* (2006.01)
*H03H 9/13* (2006.01)
*H03H 9/17* (2006.01)
*H04B 1/16* (2006.01)

(52) U.S. Cl.
CPC ............. *H03H 9/54* (2013.01); *H03H 9/13* (2013.01); *H03H 9/17* (2013.01); *H04B 1/16* (2013.01)

(58) Field of Classification Search
CPC .. H03H 9/54; H03H 9/13; H03H 9/17; H03H 9/02015; H03H 2009/02165; H03H 9/02228; H04B 1/16
See application file for complete search history.

(56) References Cited

U.S. PATENT DOCUMENTS

| 3,963,982 A * | 6/1976 | Roberts .................. G01R 29/22 |
| | | 324/727 |
| 5,488,866 A * | 2/1996 | Ravel ..................... G01N 29/12 |
| | | 73/579 |
| 10,771,037 B2 * | 9/2020 | Kojo .................. H03H 9/02015 |
| 2005/0012104 A1 * | 1/2005 | Hori ......................... G09G 3/30 |
| | | 257/79 |

(Continued)

FOREIGN PATENT DOCUMENTS

EP    0454288 A1 * 10/1991

OTHER PUBLICATIONS

Machine translation of CN-101253684-A (Year: 2013).*

(Continued)

*Primary Examiner* — Jean B Corrielus
(74) *Attorney, Agent, or Firm* — Alliance IP, LLC

(57) ABSTRACT

In one embodiment, a resonator device includes a substrate comprising a piezoelectric material and a set of electrodes on the substrate. The electrodes are in parallel and a width of the electrodes is equal to a distance between the electrodes. The RF resonator device further includes a set of switches, with each switch coupled to a respective electrode. The switches are to connect to opposite terminals of an alternating current (AC) signal source and select between the terminals of the AC signal source based on an input signal.

20 Claims, 9 Drawing Sheets

(56) References Cited

U.S. PATENT DOCUMENTS

2020/0407214 A1* 12/2020 Renault .............. B81C 1/00349

OTHER PUBLICATIONS

Machine translation of CN-103261484-A (Year: 2013).*
Machine translation of CN-107977140-A (Year: 2018).*
Machine translation of DE-102008025691-A1 (Year: 2008).*
Machine translation of JP-2002342031-A (Year: 2002).*
Machine translation of TW I615765 B (Year: 2018).*
Machine translation of WO 2014208664 A1 (Year: 2014).*
Machine translation of WO-2019138811-A1 (Year: 2019).*

* cited by examiner

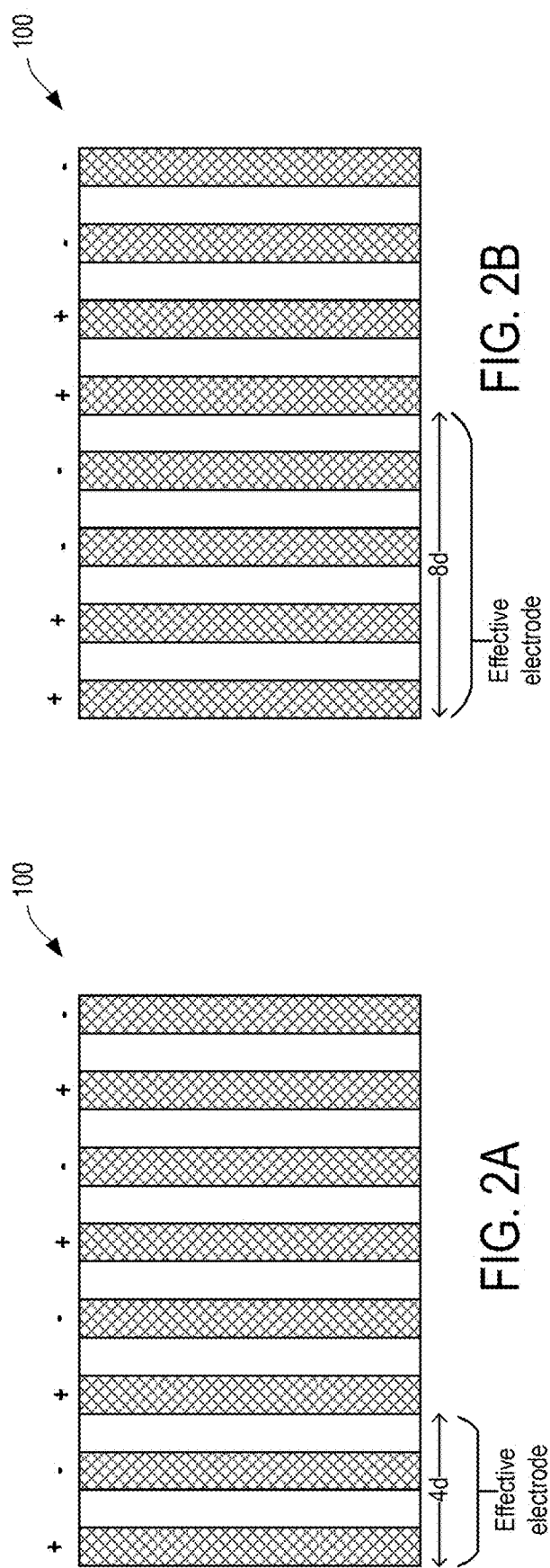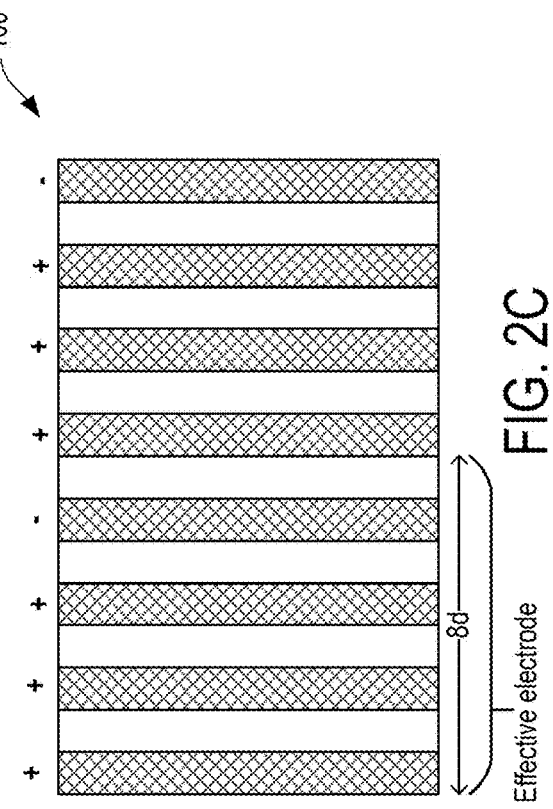

DIGITALLY CONTROLLED LITHOGRAPHICALLY-DEFINED MULTI-FREQUENCY ACOUSTIC RESONATORS

BACKGROUND

Current radio frequency (RF) filters use film bulk acoustic resonators (FBARs) for band-pass filters. FBARs have a piezoelectric layer sandwiched between metal electrodes to excite a thickness mode vibration, and the frequency of vibration depends on the thickness of the piezoelectric material. Hence, devices vibrating only at a single frequency can be designed on a given wafer with this class of devices.

BRIEF DESCRIPTION OF THE DRAWINGS

FIGS. 2A-2C illustrate example stimulation patterns for the resonator device of FIG. 1 according to embodiments of the present disclosure.

DETAILED DESCRIPTION

As described above, current FBAR resonator designs may limit design to devices vibrating only at a single frequency on a given wafer. To integrate multiple frequency resonators on the same die, contour mode resonators (CMR) and surface acoustic wave (SAW) resonators have been explored. With CMRs and SAW resonators, the frequency is defined by the pitch of metal electrodes patterned on top of the piezoelectric material (e.g., aluminum nitride (AlN) or Scandium-doped Aluminum Nitride (ScAlN)). Multiple frequencies can be accordingly defined on the same wafer using different metal critical dimensions, CDs, and pitches. However, these devices are still limited to operation at one particular frequency.

Aspects of the present disclosure relate to contour mode resonators (CMR) with selectable vibration frequencies. In particular embodiments, for example, lithographically defined resonators may be controlled via a digital voltage control of each electrode of the resonator to enable multiple resonance frequencies for the same device. Instead of using a conventional fixed alternating electrode configuration, embodiments of the present disclosure may control each electrode to allow multiple voltage configurations on demand with the same device geometry.

By incorporating digital control of individual electrodes, it is possible to achieve the following resonator capabilities that were previously not realizable: (1) use of a single CMR for generating resonances at multiple frequencies, and (2) use of a single CMR to tune the resonator coupling coefficient, and hence the filter bandwidth, at a given frequency. In addition, aspects of the present disclosure may reduce the total die area needed by producing resonances at various frequencies with a single device instead of needing a different device for each resonance frequency. For instance, by using very thin electrodes (e.g., <50 nm) achievable with immersion lithography, it may be possible to have a very large range of resonant frequencies form the same resonator device, reducing the die area requirements for filters substantially. In addition, by changing the effective duty cycle, which may be defined by the ratio of a portion of the device that gets a signal over the total device length, it may be possible to change the effective coupling, which allows tuning of the filter bandwidth.

Figure 1:
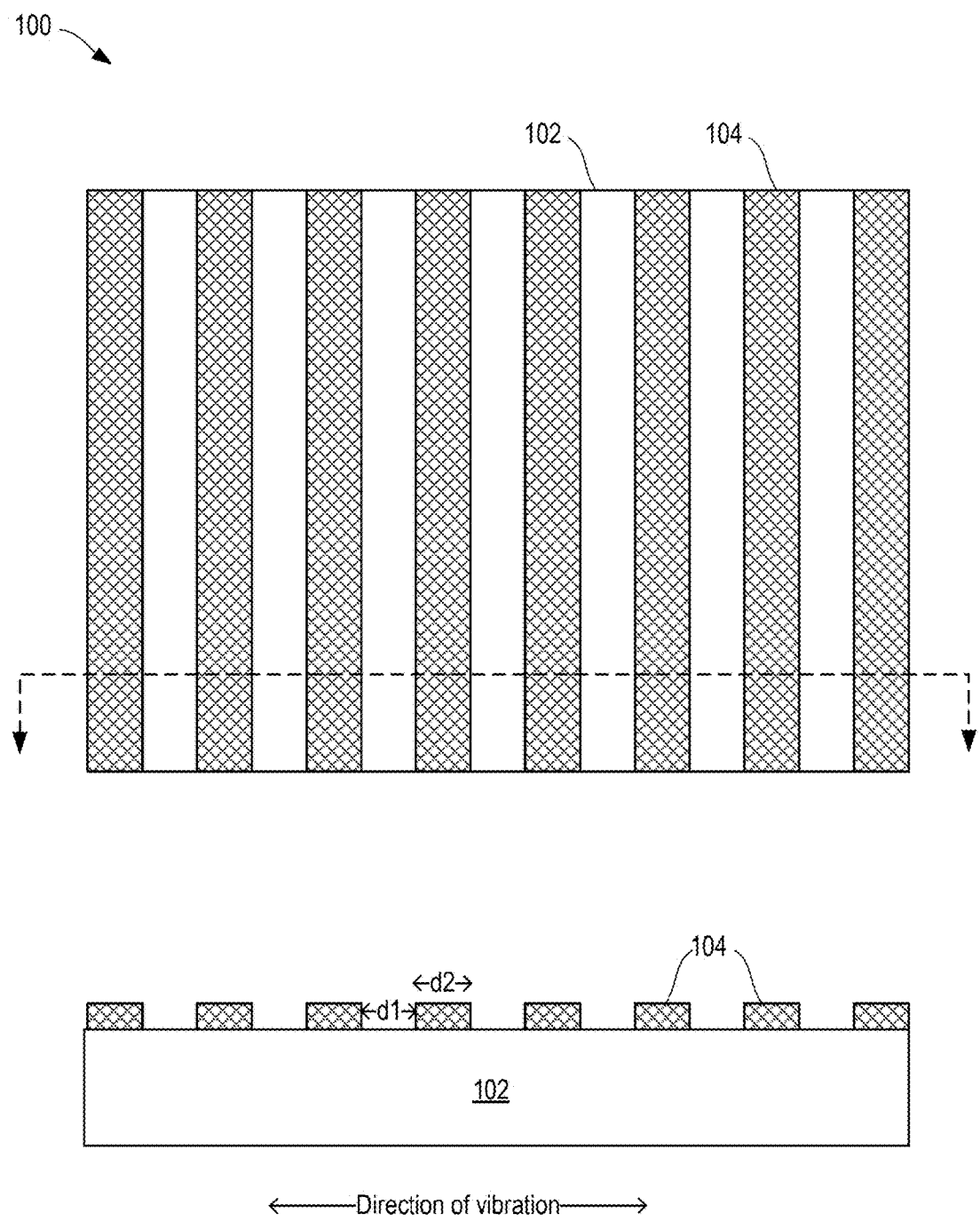
FIG. 1 illustrates top and cross-sectional views of an example resonator device according to embodiments of the present disclosure.

FIG. 1 illustrates top and cross-sectional views of an example resonator device 100 according to embodiments of the present disclosure. The example resonator device 100 includes a set of electrodes 104 patterned on top of a piezoelectric material substrate 102. In some embodiments, the electrodes 104 may be metal or may include metal (e.g., molybdenum or other refractory metals), and the piezoelectric material substrate 102 may be or include aluminum nitride (AlN) or Scandium-doped Aluminum Nitride (ScAlN) (e.g., where the Scandium doping is between approximately 2-30%). In the example shown, the spacing between the electrodes 104 on the substrate 102 is d1 and the width of the electrodes 104 is d2. In the example shown, d1=d2; however, in other embodiments, the ratio of d1/d2 may be different. For instance, in some embodiments, the ratio of d1/d2 may be 60/40 or 40/60 (e.g., for mass loading effects). Although the example device 100 includes eight electrodes 104, resonator devices according to the present disclosure may include any suitable number of electrodes 104. In each of the following examples it is assumed that d1=d2=d.

When the electrodes 104 are connected to terminals of an alternating current (AC) source signal (e.g., a radio frequency (RF) signal in an RF filter) in a particular pattern, the resonator device 100 may resonate or vibrate at a particular frequency along the direction shown in FIG. 1. In some instances, the pattern in which the electrodes 104 are connected to the AC terminals may alter the resonant frequency or other characteristics of the device 100 as described below.

FIGS. 2A-2C illustrate example stimulation patterns for the resonator device 100 of FIG. 1 according to embodiments of the present disclosure. In the example shown in FIG. 2A, the electrodes of the resonator device 100 are connected to the AC source terminals in an alternating manner, with the left most electrode connected to the positive terminal of an AC signal, the next (to the right in FIG. 2A) electrode connected to the negative terminal of the AC signal, the next (again to the right) electrode connected to the positive terminal, and so on. This example may be referred to herein as a (+−+−) voltage scheme, referring to the alternating nature of the voltages between the electrodes. In this example, the frequency of vibration for the resonator device 100 may be based on the distance between and/or the width of the electrodes of the device 100. Further in this example, the effective electrode is 4d in width.

In the example shown in FIG. 2B, the electrodes of the resonator device 100 are connected to the AC source terminals again in an alternating fashion, but with two successive electrodes connected to the same terminal. In particular, the left most electrode and the next electrode (to the right in FIG. 2B) are connected to the positive terminal of the AC signal, while the next two electrodes (again to the right) are connected to the negative terminal, with this pattern repeating. This example may be referred to as a (++−−) voltage scheme, and may double the effective wavelength of the resonator (i.e., the effective electrode is now 8d in width) and halve the resonant frequency to obtain a resonance at roughly f/2 where f is the wavelength of the resonator configuration shown in FIG. 2A.

FIG. 2C illustrates an alternative voltage scheme from that of FIGS. 2A and 2B, where the left most electrode and the next two electrodes (to the right in FIG. 2B) are connected to the positive terminal of the AC signal, and the next electrode (again to the right) being connected to the negative terminal, with this pattern repeating. This example may be referred to as a (+++−) voltage scheme, and can also be applied to achieve a resonant frequency at f/2 where f is the wavelength of the resonator configuration shown in FIG. 2A. However, in contrast to the example shown in FIG. 2B, where the resonant frequency is the same, the example shown in FIG. 2C has a different coupling coefficient. In this example, the effective wavelength is twice that in FIG. 2A and the same as in FIG. 2B, but with a 25% higher duty cycle. Because of this, the coupling coefficient of the device is different than with the FIG. 2B scheme though the resonant frequency is the same.

Although certain voltage patterns are shown in FIGS. 2A-2B, other voltage schemes may be used with the resonator device 100. For example, one or more of the electrodes of the resonator device 100 may be floated in certain embodiments. As one example, the voltage scheme may be (++0−), where "0" indicates a floating electrode inside a four electrode pattern/period. The floating may occur outside the voltage pattern/period as well, e.g., as (0 0++−_As another example, the voltage scheme may use a different number of electrodes, e.g., all eight in the example resonator device 100 (e.g., (++++−−−−)).

Figure 3:
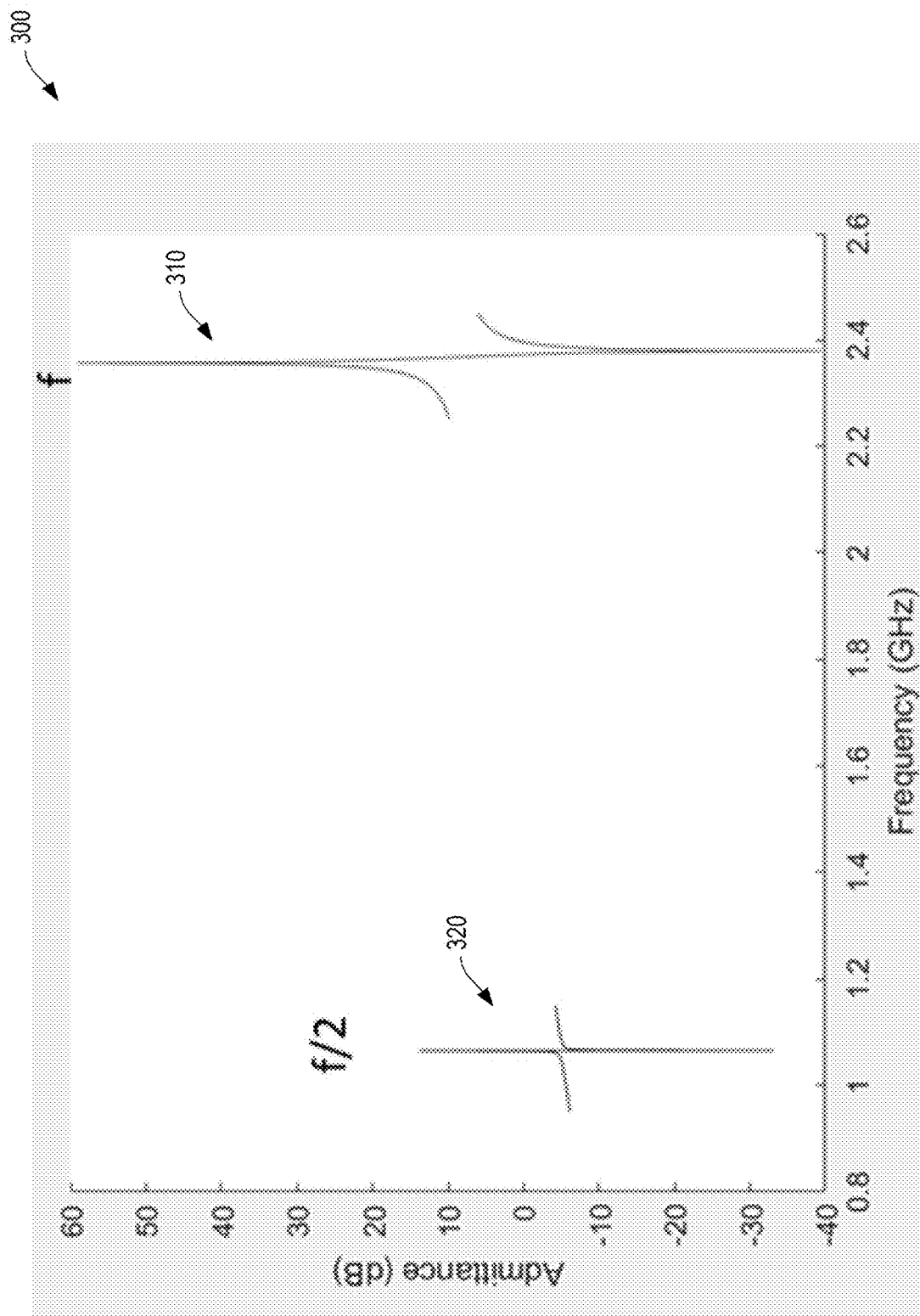
FIGS. 3-4 illustrate example simulation results for the resonator device stimulated via the patterns shown in FIGS. 2A-2C.
Figure 4:
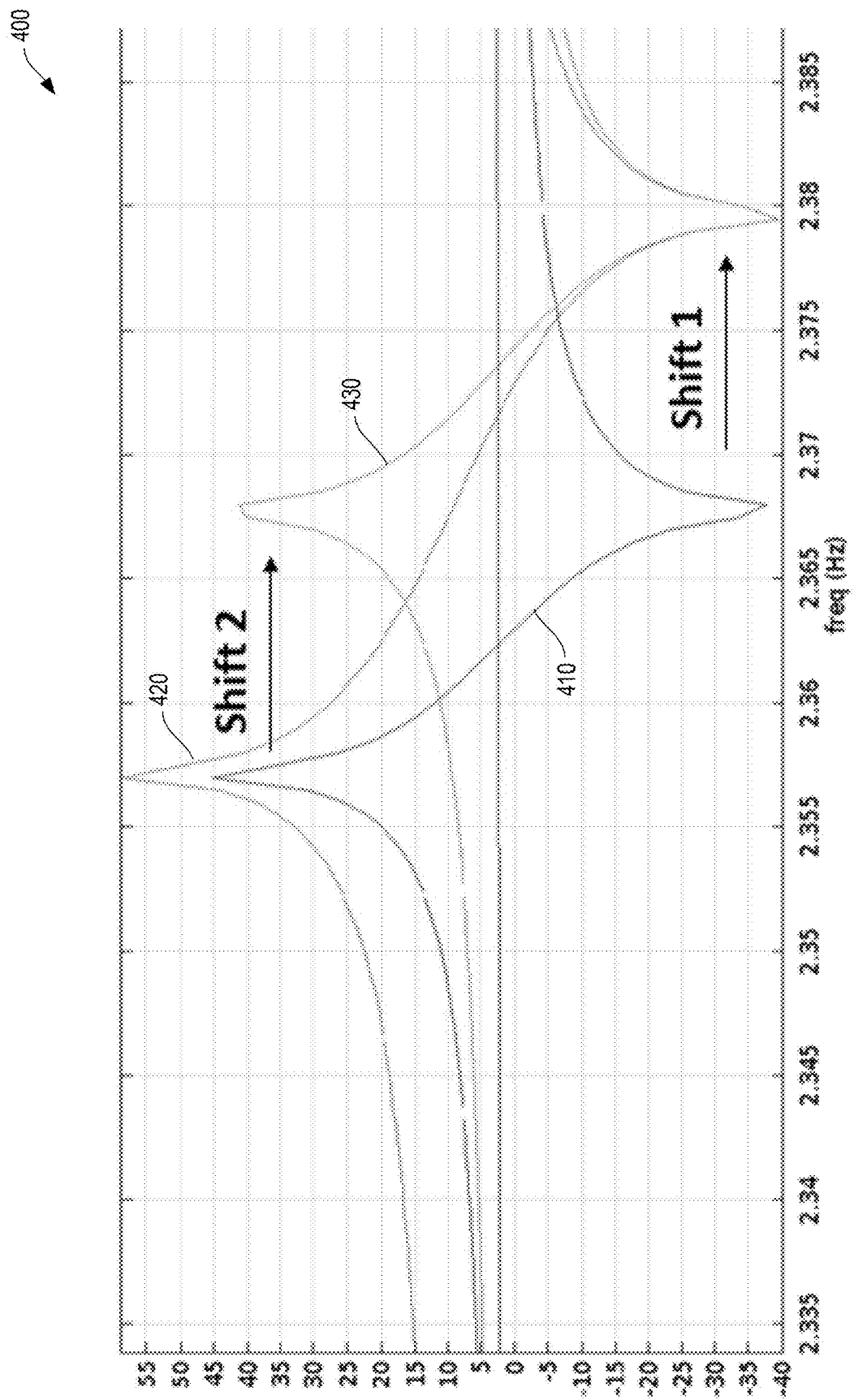

FIGS. 3-4 illustrate example simulation results for the resonator device 100 stimulated via the patterns shown in FIGS. 2A-2C. In particular, FIG. 3 illustrates a chart 300 showing a resonant frequency 310 that corresponds with the voltage scheme shown in FIG. 2A, and a resonant frequency 320 that corresponds with the voltage schemes shown in FIGS. 2B and 2C. As shown in FIG. 3 and described above, by applying a different voltage scheme to the same resonator device, the resonator wavelength and frequency may be changed, allowing for a reduction in the number of resonators needed in RF circuits (e.g., filters).

FIG. 4 illustrates a chart 400 showing the shifts in the resonator frequencies and coupling effects in more granularity. The chart 400 includes a trace 410 that corresponds with the voltage scheme shown in FIG. 2B, a trace 420 that corresponds with the voltage scheme shown in FIG. 2C, and a trace 430 that corresponds with a voltage scheme with a floating electrode (++0−) (where 0 indicates the floating electrode in the four electrode pattern).

As shown, the change from the (++−−) scheme of FIG. 2B to the (+++−) scheme of FIG. 2C causes the indicated "Shift 1", in which the coupling coefficient is changed based on the change in duty cycle between the two. In this scenario, the bandwidth of the resonance is increased, as shown by the left peaks of traces 410 and 420 being in the same location, but the right peaks/valleys of the trace 420 being at a higher frequency than that of trace 410. Further, as shown, the change from the (++−−) scheme of FIG. 2B to the (++0−) scheme causes the indicated "Shift 2", which shifts the trace 410 entirely to the right (into 430), showing the possibility for fine, marginal tuning of the resonant frequency of the device 100 by floating certain electrodes in the voltage scheme pattern, which may eliminate the need for resonator trimming in certain instances.

Figure 5:
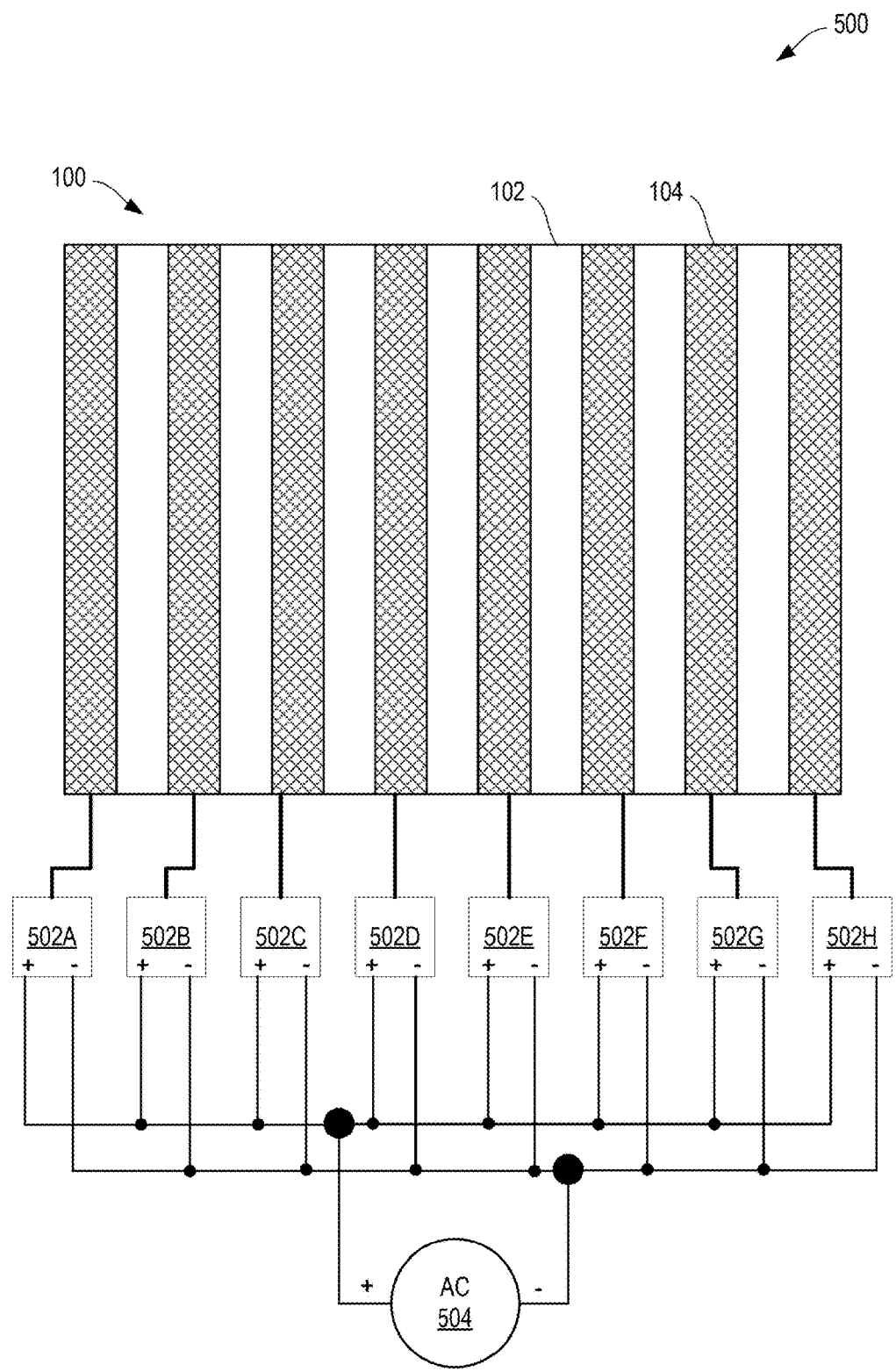
FIG. 5 illustrates an example digitally controlled multi-frequency acoustic resonator circuit according to embodiments of the present disclosure.

FIG. 5 illustrates an example digitally controlled multi-frequency acoustic resonator circuit 500 according to embodiments of the present disclosure. The example circuit 500 includes the resonator device 100 of FIG. 1 as well as a set of switches 502, with each switch 502 being connected to a respective electrode 104 of the resonator device 100. Each switch 502 is connected to both terminals of an AC signal 504, and controls which terminal of the AC signal 504 the corresponding electrode 104 is connected to. In some embodiments, the switches 502 may be complementary metal-oxide-semiconductor (CMOS)-based switches or micro-electromechanical systems (MEMS)-based switches. The switches 502 may be digitally addressable in certain instances, i.e., may be individually addressed by software, such that software may change the voltage scheme applied to the resonator device 100 on demand.

Figure 6:
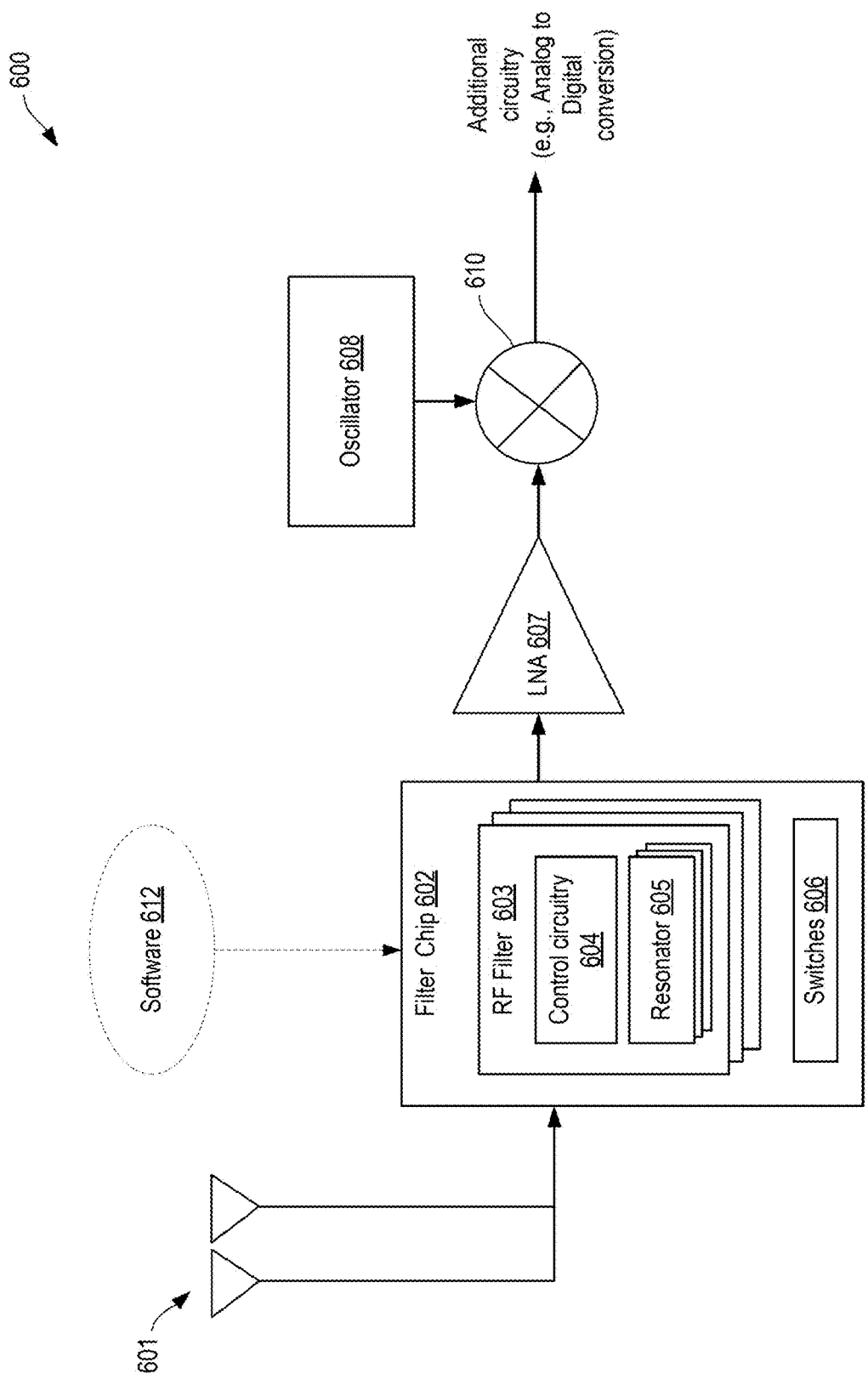
FIG. 6 illustrates an example radio frequency (RF) front end circuit that includes a digitally controlled multi-frequency acoustic resonator device according to embodiments of the present disclosure.

FIG. 6 illustrates an example radio frequency (RF) front end circuit 600 that includes a digitally controlled multi-frequency acoustic resonator device according to embodiments of the present disclosure. The example circuit 600 includes one or more antennas 601 connected to an RF filter chip 602, which is in turn connected to a low noise amplifier (LNA) 607, a mixer 610, and an oscillator 608.

The RF filter chip 602 includes a number of RF filters 602, each of which includes one or more resonator devices 605, which may include resonator devices similar to the resonator device 100. Each RF filter 603 also includes control circuitry 604 that controls the voltage scheme applied to the resonator devices 605 within the filter 603. Although shown as being within the RF filters 603 in FIG. 6, the control circuitry 604 may be separate from the RF filter 603 in certain instances, e.g., inside the filter chip 602. In some instances, the switches described above (e.g., 502) may be in the resonators 605 or the control circuitry 604. For instance, the resonator devices 605 may include software-addressable switches that control the voltage scheme applied to the resonators therein, and the control circuitry 604 may include logic circuitry to receive information from the software (e.g., 612) and based on the information, direct signals to the software-addressable switches in the resonator devices 605 to control the resonant frequency of the resonators (or other properties, e.g., the coupling coefficient and/or resonant bandwidth as described above). The RF filter chip 602 also includes switches 606 to select between the RF filters 602, e.g., for different frequency bands. In some cases, the switches 606 may be controlled by the software 612.

The RF filter(s) 603 of the RF filter chip 602 may filter the signals received from the antennas 601 using the resonator devices 605 and pass the filtered signal on to the LNA 607, which amplifies the filtered signal. The amplified signal is provided to the mixer 610, which mixes the amplified signal from the LNA 607 with a signal from the oscillator 608. The mixed signal is then provided to other circuitry, e.g., for further processing (e.g., analog to digital conversion)

Figure 7:
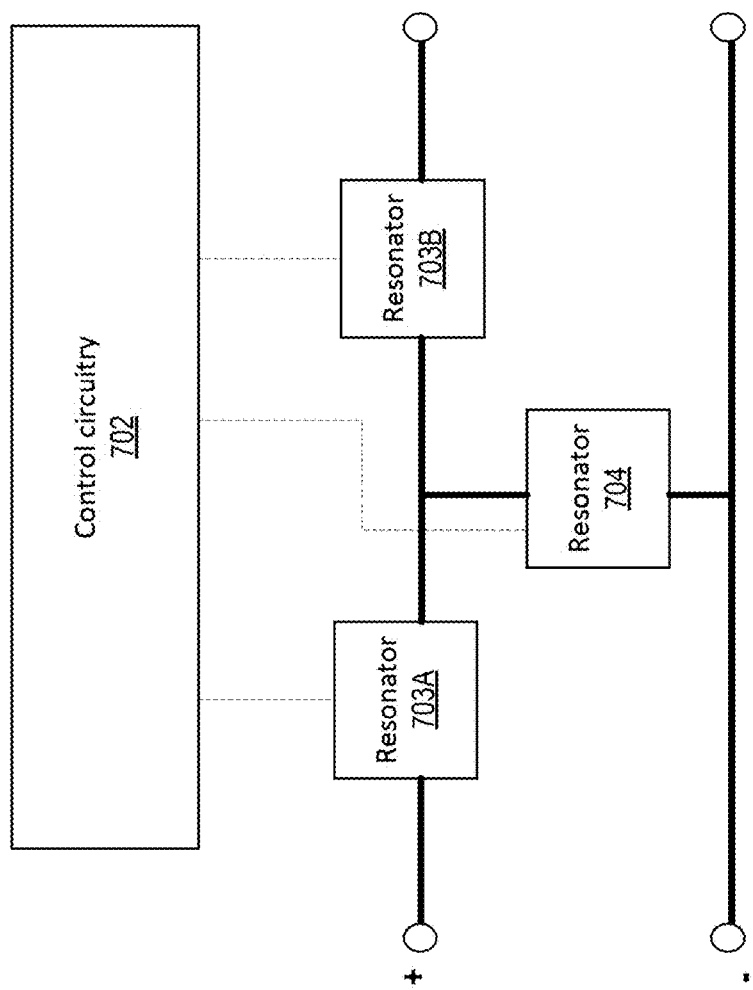
FIGS. 7-8 illustrate example resonator circuits that may be implemented within an RF filter in accordance with embodiments of the present disclosure.
Figure 8:
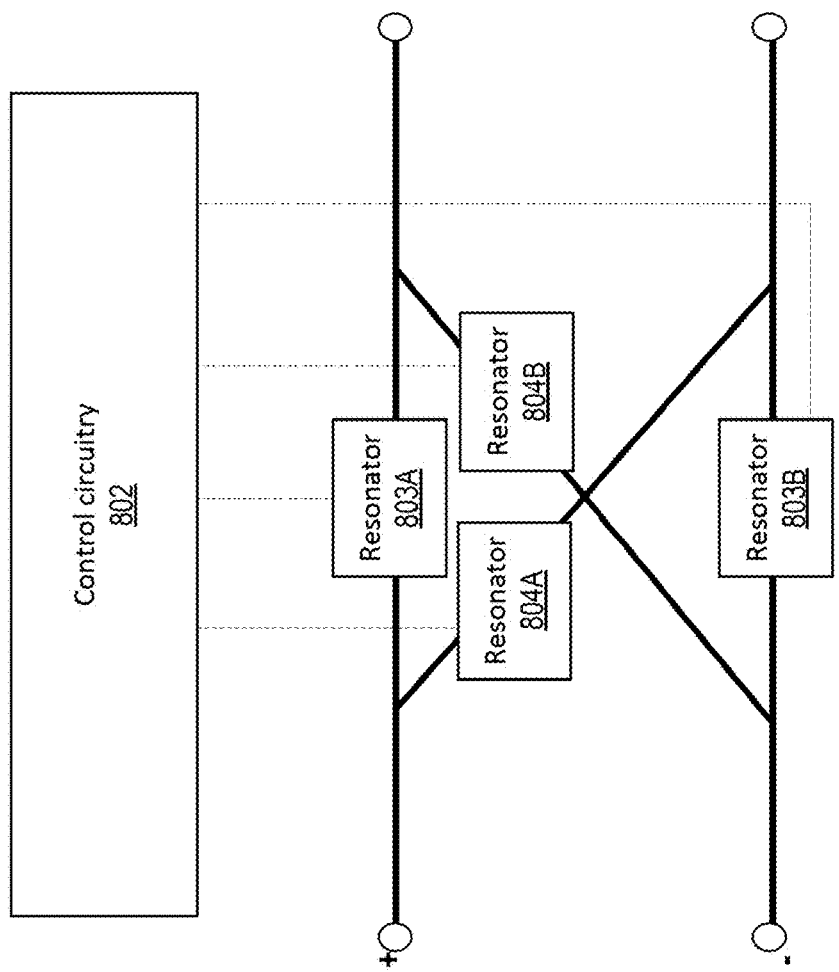

FIGS. 7-8 illustrate example resonator circuits 700, 800 that may be implemented within an RF filter in accordance with embodiments of the present disclosure. In particular, FIG. 7 illustrates an example ladder-type resonator circuit 700, and FIG. 8 illustrates an example lattice-type resonator circuit 800. In each case, the resonator circuit includes a set of series resonator devices (e.g., 703, 803) and shunt resonators devices (e.g., 704, 804). The resonant frequency responses of the resonator devices (e.g., those shown in FIG. 4) may combine to create a bandpass filter, in certain instances.

The RF resonator devices of FIGS. 7-8 may include a resonator similar to resonator 100, and may be implemented similar to the resonator circuit 500 of FIG. 5. That is, each resonator device of FIGS. 7-8 may include a resonator (e.g., 100) and a set of switches (e.g., 502) that control the voltage scheme applied to the resonator. The RF resonator circuits 700, 800 also include control circuitry (e.g., 702, 802) connected to each of the resonator devices to control the switches in the resonator devices as described above. The RF resonator circuits of embodiments may include the same or different ladder- or lattice-type configurations than those shown, or may include combinations thereof. For instance, some resonator circuits may include a latter stage followed by a lattice stage, or vice versa.

Figure 9:
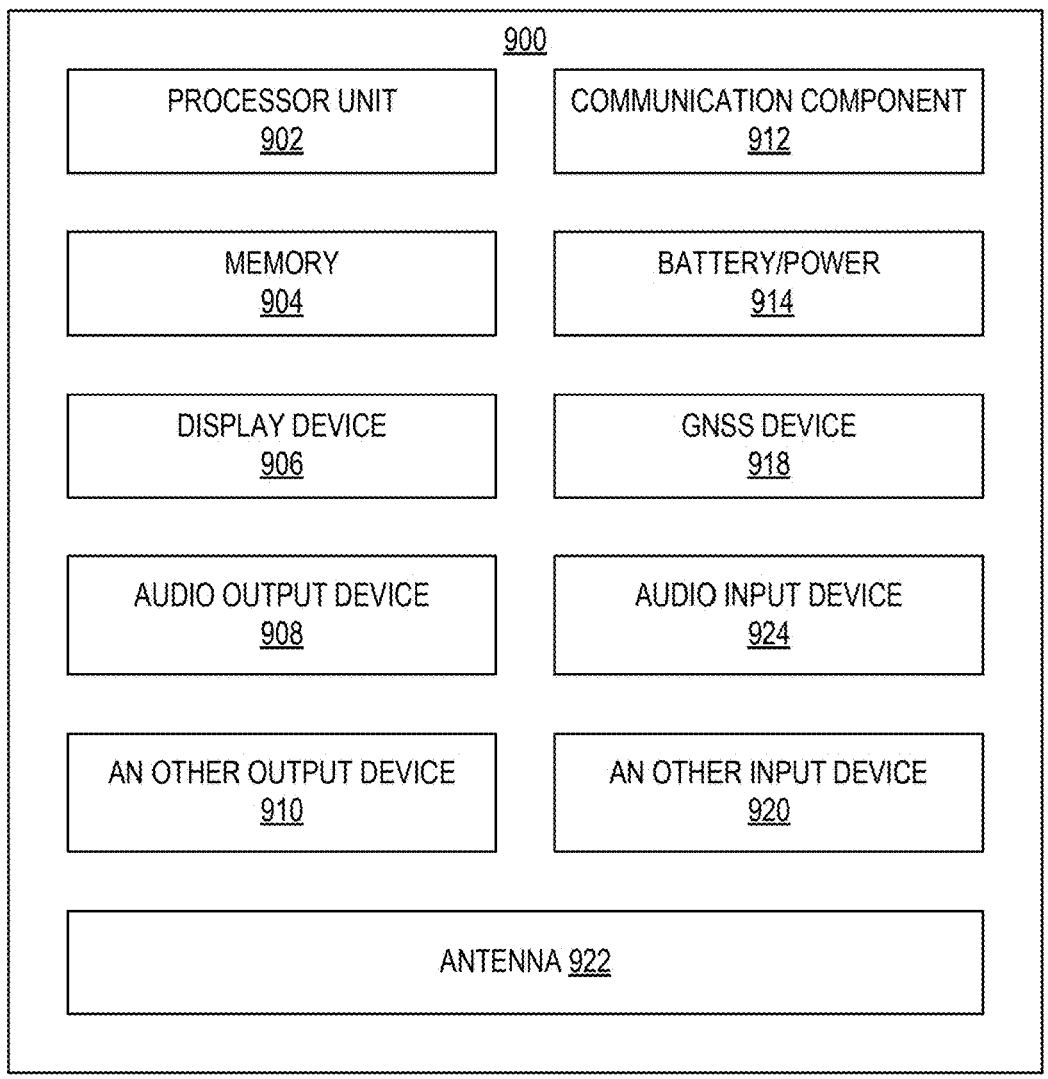
FIG. 9 is a block diagram of an example electrical device that may include a microelectronic assembly, in accordance with any of the embodiments disclosed herein.

FIG. 9 is a block diagram of an example electrical device 900 that may include one or more of the resonator devices and corresponding control circuitry as disclosed herein. A number of components are illustrated in FIG. 9 as included in the electrical device 900, but any one or more of these components may be omitted or duplicated, as suitable for the application. In some embodiments, some or all of the components included in the electrical device 900 may be attached to one or more motherboards mainboards, or system boards. In some embodiments, one or more of these components are fabricated onto a single system-on-a-chip (SoC) die.

Additionally, in various embodiments, the electrical device 900 may not include one or more of the components illustrated in FIG. 9, but the electrical device 900 may include interface circuitry for coupling to the one or more components. For example, the electrical device 900 may not include a display device 906, but may include display device interface circuitry (e.g., a connector and driver circuitry) to which a display device 906 may be coupled. In another set of examples, the electrical device 900 may not include an audio input device 924 or an audio output device 908, but may include audio input or output device interface circuitry (e.g., connectors and supporting circuitry) to which an audio input device 924 or audio output device 908 may be coupled.

The electrical device 900 may include one or more processor units 902 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 902 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 900 may include a memory 904, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 904 may include memory that is located on the same integrated circuit die as the processor unit 902. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 900 can comprise one or more processor units 902 that are heterogeneous or asymmetric to another processor unit 902 in the electrical device 900. There can be a variety of differences between the processing units 902 in a system in terms of a spectrum of metrics of merit including architectural, microarchitectural, thermal, power consumption characteristics, and the like. These differences can effectively manifest themselves as asymmetry and heterogeneity among the processor units 902 in the electrical device 900.

In some embodiments, the electrical device 900 may include a communication component 912 (e.g., one or more communication components). For example, the communication component 912 can manage wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 912 may operate in accordance with other wireless protocols in other embodiments. The electrical device 900 may include an antenna 922 to facilitate wireless communications and/or to receive other wireless communications (such as AM or FM radio transmissions). The electrical device 900 may include a front end module (such as front end circuit 600) that includes circuitry to filter signals going to/from the antenna 922.

In some embodiments, the communication component 912 may manage wired communications, such as electrical, optical, or any other suitable communication protocols (e.g., IEEE 802.3 Ethernet standards). As noted above, the communication component 912 may include multiple communication components. For instance, a first communication component 912 may be dedicated to shorter-range wireless communications such as Wi-Fi or Bluetooth, and a second communication component 912 may be dedicated to longer-range wireless communications such as global positioning system (GPS), EDGE, GPRS, CDMA, WiMAX, LTE, EV-DO, or others. In some embodiments, a first communication component 912 may be dedicated to wireless communications, and a second communication component 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display device 906 (or corresponding interface circuitry, as discussed above). The display device 906 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any embedded or wired or wirelessly connected external device that generates an audible indicator, such speakers, headsets, or earbuds.

The electrical device 900 may include an audio input device 924 (or corresponding interface circuitry, as discussed above). The audio input device 924 may include any embedded or wired or wirelessly connected device that generates a signal representative of a sound, such as microphones, microphone arrays, or digital instruments (e.g., instruments having a musical instrument digital interface (MIDI) output). The electrical device 900 may include a Global Navigation Satellite System (GNSS) device 918 (or corresponding interface circuitry, as discussed above), such as a Global Positioning System (GPS) device. The GNSS device 918 may be in communication with a satellite-based system and may determine a geolocation of the electrical device 900 based on information received from one or more GNSS satellites, as known in the art.

The electrical device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The electrical device 900 may include an other input device 920 (or corresponding interface circuitry, as discussed above). Examples of the other input device 920 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 900 may be any other electronic device that processes data. In some embodiments, the electrical device 900 may comprise multiple discrete physical components. Given the range of devices that the electrical device 900 can be manifested as in various embodiments, in some embodiments, the electrical device 900 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes resonator device comprising: a substrate comprising a piezoelectric material; a set of electrodes on the substrate, wherein the electrodes are arranged in parallel with one another; and a set of switches, wherein each switch is coupled to a respective electrode and is to connect to opposite terminals of an alternating current (AC) voltage source, the switch comprising circuitry to select between the terminals of the AC voltage source based on an input signal.

Example 2 includes the subject matter of Example 1, wherein a width of the electrodes is equal to a distance between the electrodes.

Example 3 includes the subject matter of Example 1, wherein a ratio of a width of the electrodes to a distance between the electrodes is 60/40 or 40/60.

Example 4 includes the subject matter of any one of Examples 1-3, wherein a width of the electrodes is between 50-200 nanometers.

Example 5 includes the subject matter of any one of Examples 1-4, wherein the switches are digitally addressable switches.

Example 6 includes the subject matter of any one of Examples 1-5, wherein the switches are micro-electromechanical systems (MEMS)-based switches or complementary metal-oxide-semiconductor (CMOS)-based switches.

Example 7 includes the subject matter of any one of Examples 1-6, wherein the piezoelectric material comprises aluminum and nitrogen.

Example 8 includes the subject matter of Example 7, wherein the piezoelectric material further comprises Scandium.

Example 9 includes the subject matter of any one of Examples 1-8, wherein the electrodes comprise molybdenum.

Example 10 includes a radio frequency (RF) filter apparatus comprising: input terminals to receive a radio frequency (RF) signal; a plurality of resonator devices of any one of Examples 1-9, wherein each switch is coupled to a respective electrode and is to connect to each of the input terminals, the switch comprising circuitry to select between the input terminals based on an input signal; control circuitry to control the switches of the resonator devices; and output terminals to provide a filtered RF signal.

Example 11 includes the subject matter of any one of Examples 10, wherein the plurality of resonator devices comprises a set of series resonator devices in series with the input and output terminals and a set of shunt resonator devices in parallel with the input and output terminals.

Example 12 includes the subject matter of Example 11, wherein at least certain of the series and shunt resonator devices are in a ladder-type configuration.

Example 13 includes the subject matter of Example 11, wherein at least certain of the series and shunt resonator devices are in a lattice-type configuration.

Example 14 includes the subject matter of any one of Examples 10-13, wherein the piezoelectric material comprises aluminum and nitrogen.

Example 15 includes the subject matter of Example 14, wherein the piezoelectric material further comprises Scandium.

Example 16 includes the subject matter of any one of Examples 10-15, wherein the electrodes comprise molybdenum.

Example 17 includes the subject matter of Example 16, wherein the switches are digitally addressable switches.

Example 18 includes the subject matter of any one of Examples 10-17, wherein the switches are micro-electromechanical systems (MEMS)-based switches or complementary metal-oxide-semiconductor (CMOS)-based switches.

Example 19 includes a front end apparatus comprising: a radio frequency (RF) filter apparatus, the RF filter apparatus of any one of Examples 10-18; an amplifier to receive a filtered signal output by the RF filter apparatus; and a mixer to mix the filtered signal with a signal from an oscillator device.

Example 20 includes a device comprising: a radio frequency (RF) antenna; and the front end apparatus of Example 19.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. A radio frequency (RF) resonator device comprising:
   a substrate comprising a piezoelectric material;
   a set of electrodes on the substrate, wherein the electrodes are arranged in parallel with one another; and
   a set of switches, wherein each switch is coupled to a respective electrode of the set of electrodes and is to connect to opposite terminals of an alternating current (AC) signal source, each switch comprising circuitry to select between the terminals of the AC signal source based on an input signal.

2. The RF resonator device of claim 1, wherein a width of the electrodes is equal to a distance between the electrodes.

3. The RF resonator device of claim 1, wherein a ratio of a width of the electrodes to a distance between the electrodes is 60/40 or 40/60.

4. The RF resonator device of claim 1, wherein a width of the electrodes is between 50-200 nanometers.

5. The RF resonator device of claim 1, wherein the switches are digitally addressable switches.

6. The RF resonator device of claim 1, wherein the switches are micro-electromechanical systems (MEMS)-based switches or complementary metal-oxide-semiconductor (CMOS)-based switches.

7. The RF resonator device of claim 1, wherein the piezoelectric material comprises aluminum and nitrogen.

8. The RF resonator device of claim 7, wherein the piezoelectric material further comprises Scandium.

9. The RF resonator device of claim 1, wherein the electrodes comprise molybdenum.

10. A radio frequency (RF) filter apparatus comprising:
    input terminals to receive a radio frequency (RF) signal;
    a plurality of resonator devices, each resonator device comprising:
       a substrate comprising a piezoelectric material;
       a set of electrodes on the substrate, wherein the electrodes are arranged in parallel with one another; and
       a set of switches, wherein each switch is coupled to a respective electrode of the set of electrodes and is to connect to each of the input terminals, each switch comprising circuitry to select between the input terminals based on an input signal;
    control circuitry to control the switches of the resonator devices; and
    output terminals to provide a filtered RF signal.

11. The RF filter apparatus of claim 10, wherein the plurality of resonator devices comprises a set of series resonator devices in series with the input terminals and the output terminals and a set of shunt resonator devices in parallel with the input terminals and the output terminals.

12. The RF filter apparatus of claim 11, wherein at least certain of the series resonator devices and the shunt resonator devices are in a ladder-type configuration.

13. The RF filter apparatus of claim 11, wherein at least certain of the series resonator devices and the shunt resonator devices are in a lattice-type configuration.

14. The RF filter apparatus of claim 10, wherein the piezoelectric material comprises aluminum and nitrogen.

15. The RF filter apparatus of claim 14, wherein the piezoelectric material further comprises Scandium.

16. The RF filter apparatus of claim 10, wherein the electrodes comprise molybdenum.

17. The RF filter apparatus of claim 16, wherein the switches are digitally addressable switches.

18. The RF filter apparatus of claim 10, wherein the switches are micro-electromechanical systems (MEMS)-based switches or complementary metal-oxide-semiconductor (CMOS)-based switches.

19. A front end apparatus comprising:
    a radio frequency (RF) filter apparatus to receive an RF signal, the RF filter apparatus comprising:
       input terminals to receive the RF signal;

a plurality of resonator devices, each resonator device comprising:
   a substrate comprising a piezoelectric material;
   a set of electrodes on the substrate, wherein the electrodes are arranged in parallel with one another; and
   a set of switches, wherein each switch is coupled to a respective electrode of the set of electrodes and is to connect to each of the input terminals, each switch comprising circuitry to select between the input terminals based on an input signal; and
control circuitry to control the switches of the resonator devices;
an amplifier to receive a filtered signal output by the RF filter apparatus; and
a mixer to mix the filtered signal with a signal from an oscillator device.

20. A device comprising:
a radio frequency (RF) antenna; and
the front end apparatus of claim 19.

* * * * *